US008075159B1

(12) United States Patent
Tsai

(10) Patent No.: US 8,075,159 B1

(45) Date of Patent: Dec. 13, 2011

(54) LED LAMP

(75) Inventor: Ping-Jung Tsai, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 0 days.

(21) Appl. No.: 12/903,118

(22) Filed: Oct. 12, 2010

(30) Foreign Application Priority Data

Aug. 17, 2010 (TW) .................................. 99127376

(51) Int. Cl.
*F21V 21/00* (2006.01)
*F21S 4/00* (2006.01)
*H05K 5/00* (2006.01)

(52) U.S. Cl. .............. 362/249.06; 362/249.13; 362/219; 362/612; 362/647; 362/416; 361/731

(58) Field of Classification Search .................. 362/612, 362/249.06, 647, 652–659, 257, 249.13, 362/249.14; 361/713
See application file for complete search history.

(56) References Cited

U.S. PATENT DOCUMENTS

| | | | | |
|---|---|---|---|---|
| 6,109,764 | A * | 8/2000 | Shu | 362/653 |
| 6,461,019 | B1 * | 10/2002 | Allen | 362/249.06 |
| 6,641,294 | B2 * | 11/2003 | Lefebvre | 362/544 |
| 2003/0063463 | A1 * | 4/2003 | Sloan et al. | 362/238 |
| 2007/0047229 | A1 * | 3/2007 | Lee | 362/237 |
| 2007/0136613 | A1 * | 6/2007 | Chen | 713/300 |
| 2010/0027263 | A1 * | 2/2010 | Wang | 362/373 |

* cited by examiner

*Primary Examiner* — Jong-Suk (James) Lee
*Assistant Examiner* — Tsion Tumebo
(74) *Attorney, Agent, or Firm* — Altis Law Group, Inc.

(57) ABSTRACT

An LED lamp includes an LED body and a fool-proofing device. The LED body includes a first end portion and a second end portion opposite to the first end portion. The first end portion extends a first connector and a second connector. The second end portion extends a third connector and a fourth connector. The first connector and fourth connector are arranged at the same sides of the LED body and with different polarities. The second connector and the third connector are arranged at the same sides of the LED body and with different polarities. The fool-proofing device is arranged on the first connector and the third connector, which are diagonally opposite to each other.

13 Claims, 4 Drawing Sheets

LED LAMP

BACKGROUND

1. Technical Field

The present disclosure generally relates to a lamp, and more particularly to an LED lamp with a fool-proofing capability.

2. Discussion of Related Art

Light emitting diodes (LEDs) are one kind of semiconductor element. Nowadays, LEDs are extensively used as light sources for illuminating apparatuses, due to their high luminous efficiency, low power consumption and long work life.

Conventional tubular LED lamp is electrically connected to an external power source by an anode connector and a cathode connector thereof. The connectors are similar to each other and easily mixed. When the LED lamp is assembled to the external power source by wrongly connecting the connectors with the external power, the LED lamp cannot work and the LED lamp needs to assemble with the external power again. Such manipulation is time consuming and laborious, which results in a low assembling efficiency.

Therefore, what is needed is an LED lamp which can overcome the above described shortcomings.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION OF EMBODIMENTS

Reference will now be made to the drawings to describe various embodiments of the present LED lamp in detail.

Figure 1:
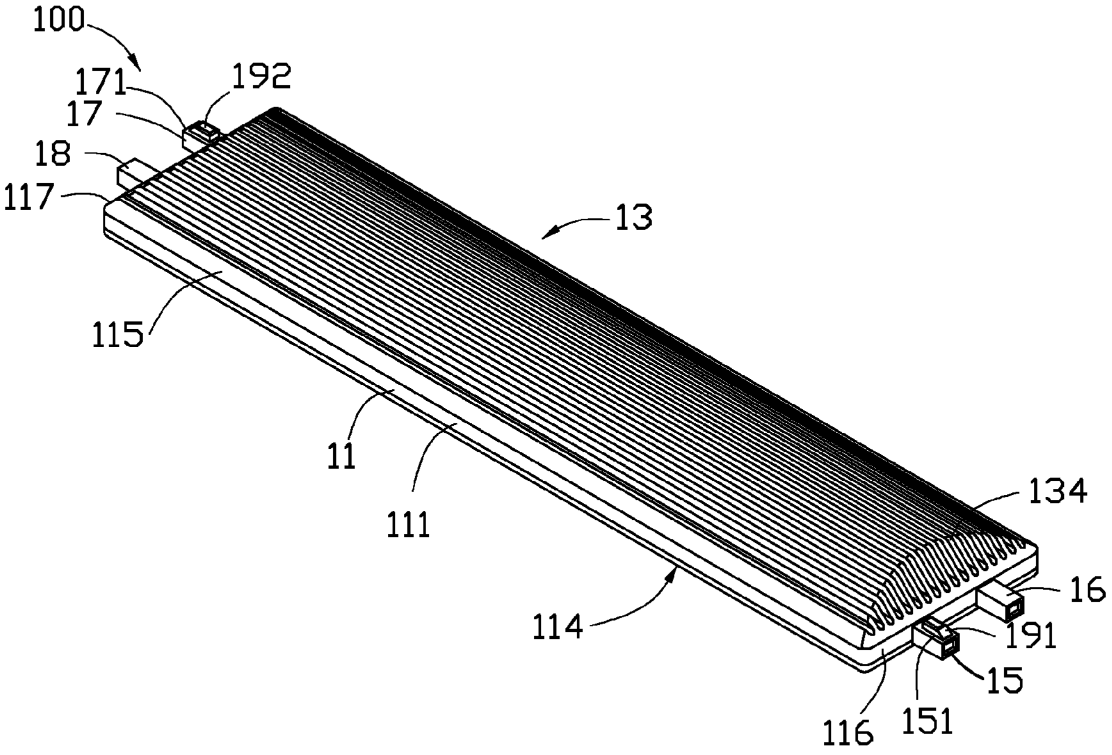
FIG. 1 is an assembled view of an LED lamp in accordance with a first embodiment of the present disclosure.
Figure 2:
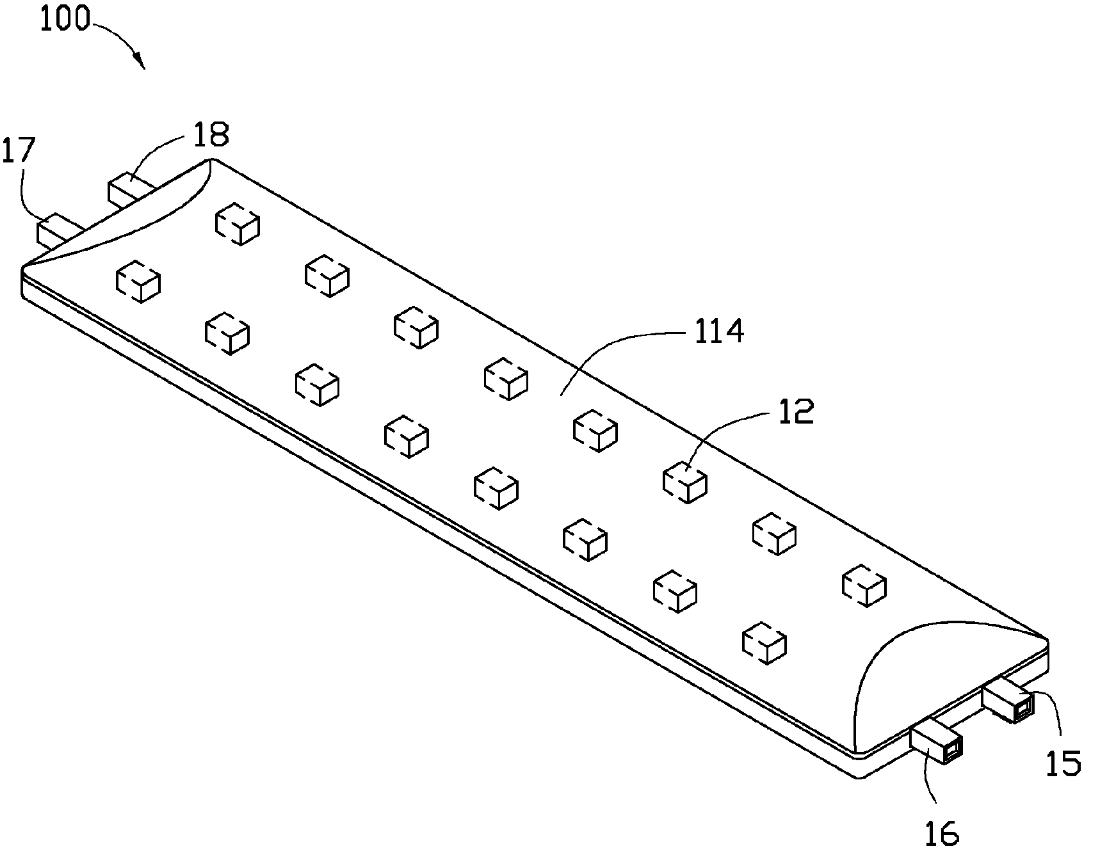
FIG. 2 is an inverted view of the LED lamp of FIG. 1.

Referring to FIGS. 1-2, an LED lamp 100, in accordance with a first embodiment, includes an LED body 11, a first connector 15, a second connector 16, a third connector 17 and a fourth connector 18.

The LED body 11 has a plate-like shape. The LED body 11 includes a substrate 111, a plurality of LEDs 12 and a heat dissipation apparatus 13. The substrate 111 includes a first surface 114 and a second surface 115 opposite to the first surface 114. The substrate 111 has a first end portion 116 and second end portion 117 which are positioned between the first surface 114 and the second surface 115.

The LEDs 12 are arranged on the first surface 114 of the substrate 111; therefore, the first surface 114 of the substrate 111 is as the light emitting surface of the LED lamp 100. In the present embodiment, the LEDs 12 are arranged in an array.

The heat dissipation apparatus 13 is arranged at the second surface 115 of the substrate 111. In the present embodiment, the heat dissipation apparatus 13 includes a plurality of fins 134 extending from the second surface 115 in an array. The fins are spaced from each other. Heights of the fins 134 gradually decrease along directions from a center one of the 111 toward lateral ones of the substrate 111; therefore, heat dissipation apparatus can have improved heat dissipation efficiency.

The first connector 15 and the second connector 16 have different polarities, which are arranged at the first end portion 116 of the substrate 111. The third connector 17 and the fourth connector 18 have different polarities, which are arranged at the second end portion 117 of the substrate 111. The first connector 15 and the third connector 17 have the same polarity (i.e., positive electricity) which are arranged at opposite sides of the substrate 111. The second connector 16 and the fourth connector 18 have the same polarity (i.e., negative electricity), which are arranged at opposite sides of the substrate 111. The first connector 15 and the third connector 17 are diagonally opposite to each other, and the second connector 16 and the fourth connector 18 are diagonally opposite to each other.

The LED lamp 100 has a fool-proofing device thereon. In the present embodiment, the fool-proofing device includes a first protrusion 191 and a second protrusion 192. The first protrusion 191 and the second protrusion 192 are rectangle. The first connector 15 has a first up-surface 151 away from the first surface 114 of the substrate 111. The first protrusion 191 is arranged on the first up-surface 151 of the first connector 15. The third connector 17 has a second up-surface 171 away from the first surface 114 of the substrate 111. The second protrusion 192 is arranged on the second up-surface 171 of the third connector 17. In the present embodiment, the first protrusion 191 and the second protrusion 192 are centrally symmetric with each other about a center of the LED lamp 100. The provision of the first and second protrusions 191, 192 ensures that the connectors 15, 16, 17, 18 are properly inserted into sockets (not shown) which have corresponding recesses to receive the protrusions 191, 192. Furthermore, the LED lamp 100 can work normally either when the LED lamp 100 is mounted to the sockets in an orientation as shown in FIG. 1 (i.e., first orientation) or in a reversed manner wherein the LED lamp 100 is horizontally rotated for 180 degrees so that the connectors 15, 16 are located at the left side and the connectors 17, 18 are located at the right side of FIG. 1 (i.e., second orientation). Two independent driving circuits (not shown) are provided in the LED lamp 100 and connected with the LEDs 12 and the connectors 15, 16, 17, 18, whereby the LED lamp 100 can work normally either in the first orientation or in the second orientation.

Figure 3:
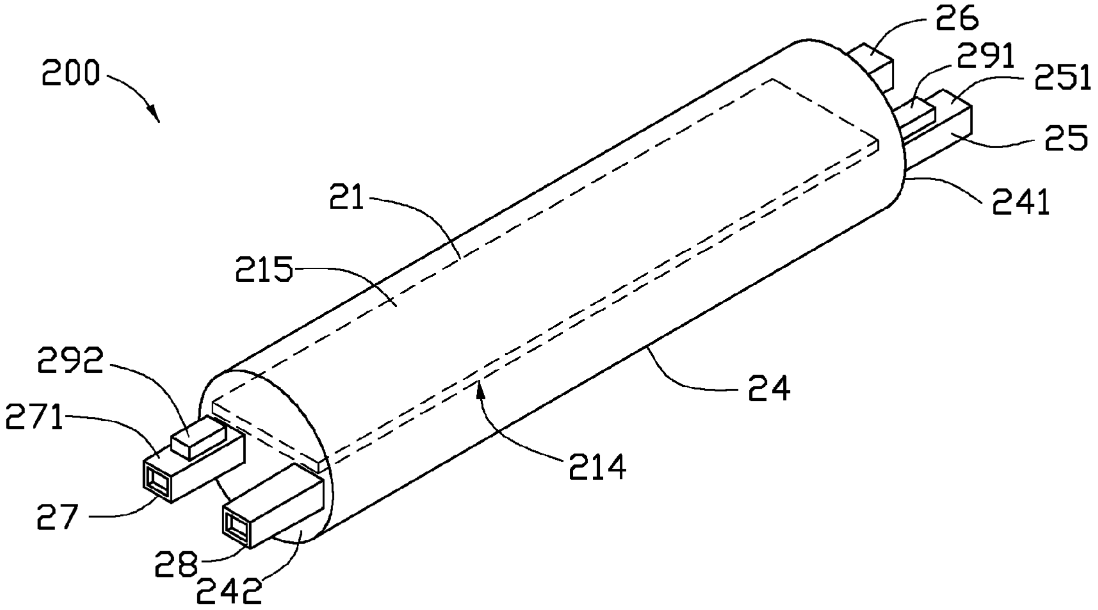
FIG. 3 is an assembled view of an LED lamp in accordance with a second embodiment of the present disclosure.
Figure 4:
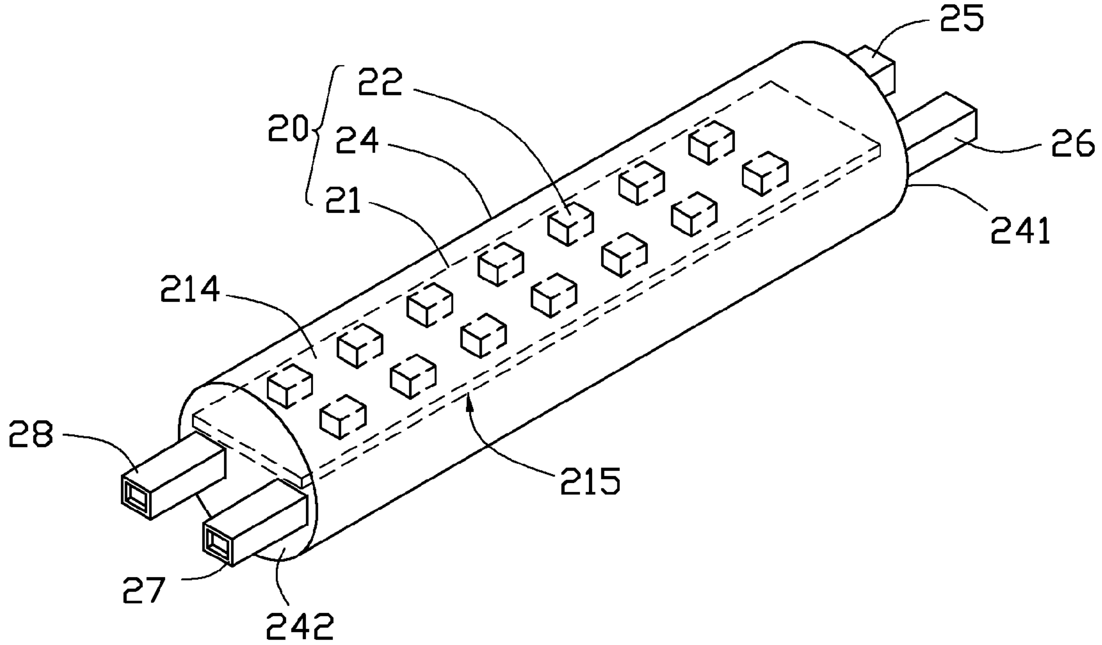
FIG. 4 is an inverted view of the LED lamp of FIG. 3.

Referring to FIGS. 3-4, an LED lamp 200 according to a second embodiment is shown. Differing from the LED lamp 100 in the first embodiment, the LED lamp 200 has a tubular shape. The LED lamp 200 includes a shell 24, a substrate 21 and a plurality of LEDs 22 arranged at the substrate 21.

The shell 24 has a hollow cylindrical configuration, which includes a first end portion 241 and a second end portion 242 opposite to the first end portion 241. In the present embodiment, the shell 24 is made of light transmissive material, such as resin, glass et al.

The substrate 21 includes a first surface 214 and a second surface 215 opposite to the first surface 214. The LEDs 22 are arranged at the first surface 214 of the substrate 21 in an array; therefore, the first surface 214 is as the light emitting surface of the LED lamp 200. Light emitted from the LEDs 22 travels through the shell 24 to outside for lighting.

The first end portion 241 of the shell 24 extends a first connector 25 and a second connector 26 which have different polarities. The second end portion 242 of the shell 24 extends a third connector 27 and a fourth connector 28 which have different polarities. The first connector 25 and the third connector 27 have the same polarity (i.e., positive electricity), which are arranged at diagonally opposite corners of the substrate 21. The second connector 26 and the fourth connector 28 have the same polarity (i.e., negative electricity), which are arranged at diagonally opposite corners of the substrate 21.

The first connector 25 includes a first up-surface 251. The third connector 27 includes a second up-surface 271. In the present embodiment, the first up-surface 251 and the second up-surface 271 are located at the same sides of the second surface 215 of the substrate 21. The LED lamp 200 has a fool-proofing device thereon. In the present embodiment, the fool-proofing device includes a first protrusion 291 and a second first protrusion 292. The first protrusion 291 and the second protrusion 292 are rectangle. The first protrusion 291 is arranged on the first up-surface 251 of the first connector 25. The second protrusion 292 is arranged on the second up-surface 271 of the third connector 27.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A light emitting diode (LED) lamp comprising:

an LED body comprising a first end portion and a second end portion opposite to the first end portion, the first end portion extending a first connector and a second connector, the second end portion extending a third connector and a fourth connector, the first connector and fourth connector being arranged at the same sides of the LED body and with different polarities, and the second connector and the third connector being arranged at the same sides of the LED body and with different polarities, the first connector and the third connector having a same polarity and being located diagonally opposite to each other, the second connector and the fourth connector having a same polarity and being located diagonally opposite to each other; and a fool-proofing device being arranged on the first connector and the third connector whereby the first, second, third and fourth connectors are correctly connected with sockets.

2. The LED lamp of claim 1, wherein the fool-proofing device comprises a first protrusion and a second protrusion, the first and second protrusions being arranged at the first connector and the third connector, respectively.

3. The LED lamp of claim 2, wherein the LED body includes a substrate and a plurality of LEDs, the substrate comprising a first surface, a second surface opposite to the first surface, the first end portion and the second end portion being positioned between the first surface and the second surface, the LEDs being arranged at the first surface of the substrate.

4. The LED lamp of claim 3, wherein the first connector has a first up-surface away from the first surface of the substrate, and the third connector has a second up-surface away from the first surface of the substrate, the first and second protrusions being arranged at the first up-surface and the second up-surface, respectively.

5. The LED lamp of claim 2, further comprising a heat dissipation apparatus being arranged at the second surface of the substrate.

6. The LED lamp of claim 5, wherein the heat dissipation apparatus comprises a plurality of fins arranged in an array.

7. The LED lamp of claim 1, wherein the LED body has a tubular shell and a substrate surrounded by the tubular shell.

8. The LED lamp of claim 7, wherein the substrate comprises a first surface, the first connector comprising a first up-surface, the third connector comprising a second up-surface, the first up-surface and the second up-surface being positioned at the same sides of the first surface of the substrate, the fool-proofing device comprising a first protrusion and a second protrusion, the first and second protrusions being arranged at the first up-surface and the second up-surface, respectively.

9. A light emitting diode (LED) lamp comprising:

an LED body comprising a first end portion and a second end portion opposite to the first end portion, the first end portion extending a first connector and a second connector, the second end portion extending a third connector and a fourth connector, the first connector and third connector being with a same polarity, the second connector and the fourth connector being with a same polarity, the polarities of the first connector and the second connector being different, the first connector and the third connector being located diagonally opposite to each other, the second connector and the fourth connector being located diagonally opposite to each other; and a first fool-proofing device and a second fool-proofing device being arranged at the first connector and the third connector, respectively, and the first fool-proofing device and a second fool-proofing being centrally symmetric with each other about a center of the LED lamp.

10. The LED lamp of claim 9, wherein the first fool-proofing device comprises a first protrusion, the second fool-proofing device comprises a second protrusion, and the first protrusion and the second protrusion are arranged at the same sides of the first connector and the third connector.

11. The LED lamp of claim 9, wherein the LED body includes a substrate, the substrate comprising a first surface, the first connector having a first up-surface away from the first surface of the substrate, and the third connector having a second up-surface away from the first surface of the substrate, the first and second first fool-proofing device being arranged at the first up-surface and the second up-surface, respectively.

12. The LED lamp of claim 9, wherein the LED body includes a tubular shell and a substrate surrounded by the tubular shell.

13. The LED lamp of claim 12, wherein the substrate of the LED body comprises a first surface, the first connector comprising a first up-surface, the third connector comprising a second up-surface, the first up-surface and the second up-surface being positioned at the same sides of the first surface of the substrate, the fool-proofing device comprising a first protrusion and a second protrusion, the first and second protrusions being arranged at the first up-surface and the second up-surface, respectively.

* * * * *